United States Patent [19]
Arledge et al.

[11] Patent Number: 5,869,899
[45] Date of Patent: Feb. 9, 1999

[54] HIGH DENSITY INTERCONNECT SUBSTRATE AND METHOD OF MANUFACTURING SAME

[75] Inventors: John K. Arledge, Fort Lauderdale; Thomas J. Swirbel, Davie, both of Fla.

[73] Assignee: Motorola, Inc., Schaumburg, Ill.

[21] Appl. No.: 78,115

[22] Filed: May 13, 1998

Related U.S. Application Data

[62] Division of Ser. No. 617,156, Mar. 18, 1996.

[51] Int. Cl.⁶ .................................................. H01L 23/48
[52] U.S. Cl. .......................... 257/738; 257/780; 257/697
[58] Field of Search ................................ 257/737, 738, 257/751, 762, 766, 773, 776, 780, 786, 697

[56] References Cited

U.S. PATENT DOCUMENTS

| | | | |
|---|---|---|---|
| 4,354,911 | 10/1982 | Dodd et al. | 204/192 |
| 4,807,021 | 2/1989 | Okumura | 357/75 |
| 4,827,326 | 5/1989 | Altman et al. | 357/67 |
| 4,908,689 | 3/1990 | McBride et al. | 357/67 |
| 5,045,921 | 9/1991 | Lin et al. | 257/780 |
| 5,103,290 | 4/1992 | Temple et al. | 357/74 |
| 5,403,776 | 4/1995 | Asuji et al. | 437/183 |
| 5,473,814 | 12/1995 | White | 29/840 |
| 5,579,573 | 12/1996 | Baker et al. | 29/840 |
| 5,600,180 | 2/1997 | Kusaka et al. | 257/692 |
| 5,604,379 | 2/1997 | Mori | 257/738 |
| 5,703,406 | 12/1997 | Kang | 257/780 |
| 5,726,500 | 3/1998 | Duboz et al. | 257/777 |
| 5,729,051 | 3/1998 | Nakamura | 257/780 |
| 5,757,078 | 5/1998 | Matsuda et al. | 257/738 |
| 5,777,391 | 7/1998 | Nakamura et al. | 257/778 |

*Primary Examiner*—Valencia Martin-Wallace
*Assistant Examiner*—David B. Hardy
*Attorney, Agent, or Firm*—Dale W. Dorinski

[57] ABSTRACT

A method of creating high density interlayer interconnects on circuit carrying substrates. A circuit pattern (20) is formed on one side of a substrate (10), and gold balls (30) are selectively placed on the circuit pattern using a thermosonic ball bonder. A liquid solution of a polymer is cast directly on the substrate and the etched circuit pattern such that only the upper portion of each gold ball is revealed when the liquid polymer solution is then dried and cured to form a dry film (40). A second layer of metal is then deposited directly on the dry film, such that it is electrically and mechanically connected to the exposed top of the gold balls. A second circuit pattern (50) is then formed in the second layer of metal. The resulting high density interconnect has two circuit layers separated by a dielectric layer. Each circuit layer is connected to the other by the gold balls that serve as conductive vias.

5 Claims, 1 Drawing Sheet

content truncated …

HIGH DENSITY INTERCONNECT SUBSTRATE AND METHOD OF MANUFACTURING SAME

CROSS REFERENCE TO RELATED APPLICATIONS

This is a divisional of application Ser. No. 08/617,156, filed Mar. 18, 1996, by Arledge, et al., entitled "High Density Interconnect Substrate and Method of Manufacturing Same," and assigned to Motorola, Inc.

TECHNICAL FIELD

This invention relates in general to high density interconnects, and more specifically to a method of forming high density interlayer interconnects on circuit carrying substrates using metal bumps.

BACKGROUND

The ever-increasing performance capabilities and requirements of integrated circuit chips requires an increasing number of interconnections between chips at the substrate level. To fulfill this need, multilayer ceramic module technology was developed. The substrates for these modules had many (up to 23) layers, and each layer began as a part of a continuous cast sheet of ceramic material, which was cut into pieces 175 mm square, then punched with holes at high speed so that electrical connections could later be made between layers. Conductive paste was then extruded onto the green sheets through metal masks, forming a wiring pattern unique to a given layer. Stacks of these sheets, with the required configurations of conducting line and insulating layers, layer-to-layer connections, and reference and power planes, were laminated together and trimmed to form individual modules, which were then fired in a furnace to harden the ceramic. Finally, the upper surface of the module was plated with the chip sites. After electrical testing of the ceramic modules and the attachment of the input/output pins, a number of chips, at most nine but more typically six, were joined to their plated sites using Controlled Collapse Chip Connection (C4) joints. Up to 10 m of wiring could be contained within these 4 mm thick multilayer modules.

A more recent alternative to the multilayer ceramic module is the multilayer printed circuit board (PCB) that is fabricated by interleaving the cores with additional sheets of prepreg and copper foil. Lamination, hole drilling, photolithography, and plating processes are repeated to construct a multilayer composite. Although the process flow for the fabrication of a multilayer board is fairly simple, even multilayer circuit boards with just a few layers may require a hundred process steps. These are necessary to ensure interfacial cleanliness, to develop adequate adhesion of copper circuitry to the base resin, to achieve resist adhesion and proper resist performance, and to maintain the integrity of the inter-plane joint in the plated through-holes. As a consequence of the complex sequence of highly diverse processing steps, the circuit board materials are exposed to a number of very aggressive environments. These include aqueous etching/plating solutions, aqueous solutions or organic solvents for developing and stripping photoresists, various cleaning and degreasing agents, and high-temperature soldering operations. Each process has a high degree of complexity with the possibility of many types of interactions.

Clearly, one can see that it is difficult to control the quality and manufacturing process in both the ceramic module and the multilayer PCB, and that the inherent complexity of the manufacturing process mitigates against low cost and high reliability. A better method of making a multilayer high density interconnect substrate would be a significant contribution to the industry.

DETAILED DESCRIPTION OF THE PREFERRED EMBODIMENT

High density interconnects between conductor layers can be created on circuit carrying substrates by forming a circuit pattern on one side of a substrate, and selectively bonding gold balls to the circuit pattern using a thermosonic ball bonder. A liquid solution of a polymer cast directly on the substrate and the etched circuit pattern acts as a dielectric barrier layer to encapsulate and protect the circuit pattern. The dielectric layer is formed in such a way that only the upper portion of each gold ball is revealed when the liquid polymer solution is then dried and cured to form a dry film. A second layer of metal is then deposited directly on top of the dry film, such that it is electrically and mechanically connected to the exposed top of the gold balls. Another circuit pattern is then formed in the second layer of metal. The resulting high density interconnect has two circuit layers separated by a dielectric layer. Each circuit layer is connected to the other by the gold balls that serve as conductive vias, thus producing a multilayer circuit.

Figure 1:
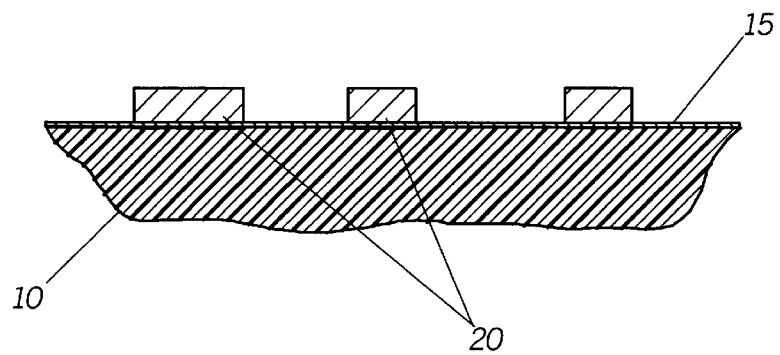
FIG. 1 is a cross-sectional view of a two layer substrate in accordance with the invention.

While the specification concludes with claims defining the features of the invention that are regarded as novel, it is believed that the invention will be better understood from a consideration of the following description in conjunction with the drawing figure, in which like reference numerals are carried forward. For purposes of illustration, some features in the drawing are in exaggerated size, to aid in understanding the invention. Referring now to FIG. 1, a cross-sectional view depicts a structure with electrically conductive circuit traces 20 formed on a substrate 10. The substrate 10 is typically a material such as a flexible film or a printed circuit board (PCB) laminate (FR-4, polyimide/glass, Teflon/glass or equivalents), but may also be an inorganic substrate such as alumina ceramic, glass or equivalents thereof. The circuit traces 20 are typically fabricated from copper, nickel, aluminum, gold or combinations thereof, with gold-plated copper preferred. Various methods and techniques of forming circuit traces on substrates are well known to those skilled in the art, for example U.S. Pat. 4,354,911, incorporated herein by reference. Although many techniques exist for forming the metal pattern, a preferred technique will now be elaborated upon. The circuit traces are patterned and etched or pattern-plated on the substrate using standard electroplating or additive methods. In one embodiment using electroplating, a seed layer 15 of metal such as chrome and copper is first applied to the substrate surface prior to patterning and plating the circuit traces. The seed layer 15 may be deposited by electroless methods or by vacuum deposition (sputtering or evaporation). The seed layer 15 is very thin (on the order of 100–10,000 Angstroms), and serves to provide an adhesive link between the plated layers and the substrate. A more substantial layer of metal (typically on the order of 2–30 microns) is then formed on the seed layer, and this layer is transformed into the circuit traces 20 by appropriate etching, photolithography or plating steps.

Figure 2:
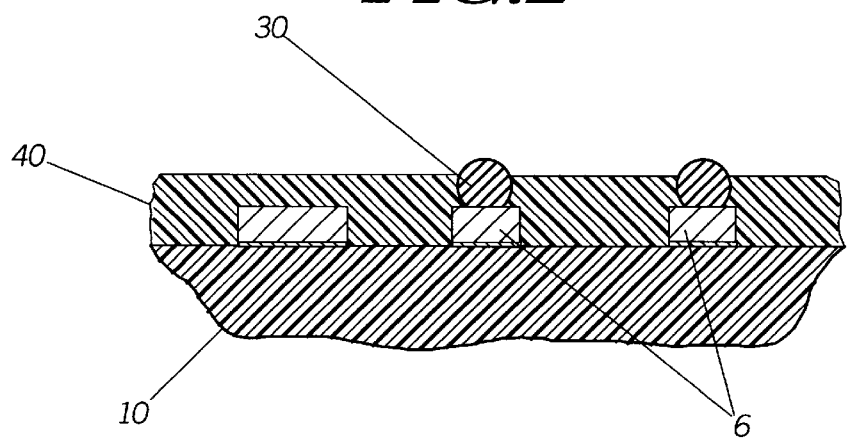
FIG. 2 is a cross-sectional view of a two layer substrate in accordance with the invention.

Referring now to FIG. 2, after the circuit traces are formed, metal bumps 30 or balls are attached to selective locations on the traces, typically conductor pads 6. These pads will subsequently serve to provide electrical or thermal connectivity to a subsequent metal layer(s). The metal bumps 30 may be gold, aluminum or copper, but gold is the preferred material. In the instant invention the bumps are formed using a thermosonic ball bonder such as a Kulicke & Soffa model 1419, which is widely used in the semiconductor packaging industry for wire bonding integrated circuits. However, in our invention, the ball bonding technique is modified to only form the ball-portion of the wirebond, and not the entire wirebond loop and foot. Although thermosonic bonding is the preferred method, ultrasonic or thermocompression bumping may also be used. Ball bumping of semiconductor wafers has been successfully demonstrated by IBM and others, but has historically been limited to bumping integrated circuits for direct die attach. Detailed information on ball bumping semiconductors may be found in the literature. The use of thermosonically attached bumps to form a conductive via is an improvement over conventional techniques such as plating or brazing pedestals, because it enables vias to be easily and reproducibly formed with diameters as small as 0.02 mm, and requires far fewer process steps. Typically, the preferred range of ball diameter is between 0.05 mm and 0.15 mm. One factor that influences the size of the bump is the thickness of the dielectric layer that will be applied in the subsequent step.

After the metal bumps 30 are attached to the circuit trace pads, a dielectric layer 40 is formed on the substrate to cover the circuit traces and the substrate surface. The dielectric layer may be a polyimide, polybutadiene, polytetrafluoroethylene, liquid crystal polymer, acrylic, epoxy, benzocyclobutene or spun-on glass. Other specific types of organic or inorganic materials that are dissolved or suspended in a solution may also be used, as long as they provide a non-conductive layer. We have found that Ciba 64 and Ciba 7081 (manufactured by the Ciba-Geigy Corporation), Shipley Multiposit 9500 (manufactured by Shipley Corporation) and benzocyclobutene (obtained from Dow Chemical) all work well as dielectric layers. The dielectric layer is applied from a liquid solution using techniques such as spin, spray, curtain, roller, doctor blade, extrusion, or meniscus coating. Each of these techniques forms coatings of varying thicknesses, and depending on which technique and which dielectric material is used, the deposition parameters must be adjusted accordingly so as to form a coating with a thickness such that it does not completely cover the metal bump 30, but keeps the upper portion of the ball exposed. The intent is to create a dielectric coating that, when cured into a dry film, isolates the underlying circuit traces, but allows the top part of the metal bumps to be revealed and not coated with dielectric material. For example, if the bumps have a diameter of about 0.1 mm, then the thickness of the dried film should be about 50–90% of the bump diameter, or between 0.05 and 0.09 mm. Typically, we find that when the film thickness is correct, the applied liquid film tends to 'dewet' or pull back from the metal bumps, and thus forms a coating that exposes the tops of the bumps. If, after applying and curing the dielectric layer, a very thin layer of material remains on the upper surface of the bump, it can be removed by using a mild plasma descumming step in oxygen or oxygen/$CF_4$ plasma. This has been found to be effective in removing very thin amounts of the dielectric material, exposing a clean metal surface of the ball. It is not necessary to use a selective mask to descum or reactive ion etch away the material on the top of the surface of the ball because the amount of material is significantly less than on the surface. The instant invention also provides the advantage of not needing to employ complex photolithography steps to pattern the dielectric layer, thus eliminating time and cost from the fabrication process.

Figure 3:
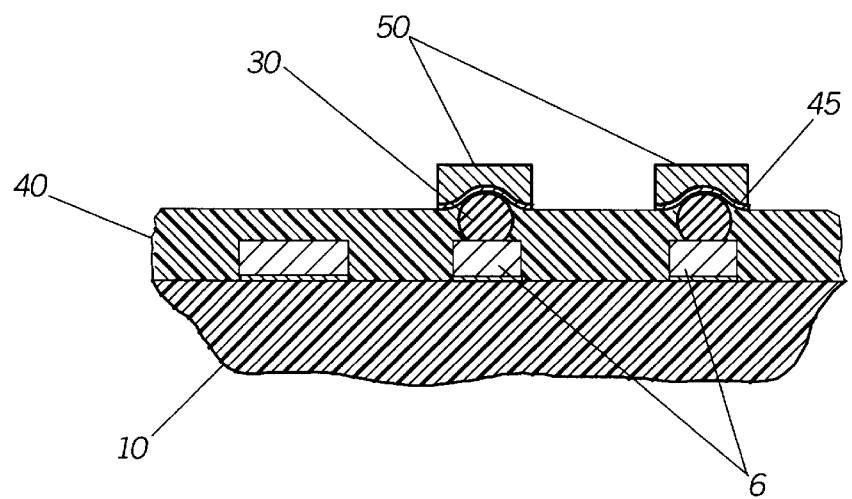
FIG. 3 is a cross-sectional view of a two layer substrate in accordance with the invention.

Referring now to FIG. 3, the cured dielectric layer 40 is then further metallized to form a second circuit layer 50. The second metal layer is formed by using processes similar to those used to form the initial circuit layer directly on the substrate, and a preferred method is sputtering a seed layer 45 of chrome, nichrome, or titanium directly on the cured dielectric layer 40. Additionally, electroless copper may be used as the seed layer. This thin seed layer also covers the exposed tops of the metal bumps 30. The metal is made thicker in subsequent plating steps (conventional electroless or electroplating, and using additive, semi-additive or subtractive methods, as desired by the reader). The second circuit layer 50 thus makes electrical contact to the exposed surface of the metal bump 30, and thus provides electrical and/or thermal contact to the conductive pads 6 of the first circuit pattern, even though the first and second circuit layers are generally separated by a dielectric insulating layer.

If desired, the process may be repeated again to create a substrate with three or more conductive layers. The second circuit layer is bumped with metal balls as before, and a dielectric coating is applied (revealing the bumps on the second circuit layer), and a third circuit layer is formed. Continued interation of this process results in a substrate with "n" conductive metal layers.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A high density interlayer interconnects for circuit carrying substrates, comprising:
    a substrate containing a first circuit pattern on a major surface thereof;
    a gold or copper ball bonded to a portion of the circuit pattern;
    a polymer dielectric layer covering the major surface and the circuit pattern, and arranged so that an upper portion of the ball is revealed; and
    a second circuit pattern disposed directly on the dielectric layer and the ball, portions of the second circuit pattern electrically and mechanically attached to the revealed upper portion of the ball to provide a high density interconnection between the first and second circuit patterns.

2. The high density interlayer interconnects as described in claim 1, wherein the first circuit pattern comprises copper with nickel and gold plated thereon.

3. The high density interlayer interconnects as described in claim 1, wherein the gold or copper ball is between 0.02 mm and 0.15 mm.

4. The high density interlayer interconnects as described in claim 1, wherein the polymer dielectric layer is selected from the group consisting of polyimide, polybutadiene, polytetrafluoroethylene, liquid crystal polymer, acrylic, epoxy, and benzocyclobutene.

5. The high density interlayer interconnects as described in claim 1, wherein the second circuit pattern is electroless metal or sputtered metal.

* * * * *